(12) United States Patent
Guilford et al.

(10) Patent No.: US 9,319,050 B1
(45) Date of Patent: Apr. 19, 2016

(54) MULTIPLE SYNCHRONIZABLE SIGNAL GENERATORS USING A SINGLE FIELD PROGRAMMABLE GATE ARRAY

(71) Applicant: Keysight Technologies, Inc., Minneapolis, MN (US)

(72) Inventors: John H. Guilford, Stanwood, WA (US); Gidget A. Cathcart, Fort Collins, CO (US); Steven Joseph Narciso, Loveland, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/179,736

(22) Filed: Feb. 13, 2014

(51) Int. Cl.
*H03L 7/06* (2006.01)

(52) U.S. Cl.
CPC .......................................... *H03L 7/06* (2013.01)

(58) Field of Classification Search
USPC .............................................. 327/156, 9, 159
See application file for complete search history.

(56) References Cited

U.S. PATENT DOCUMENTS

| | | | |
|---|---|---|---|
| 5,521,599 A * | 5/1996 | McCarroll et al. | 341/122 |
| 6,838,918 B1 | 1/2005 | Kaviani | |
| 7,089,442 B2 | 8/2006 | Chang et al. | |
| 7,567,099 B2 | 7/2009 | Edwards et al. | |
| 7,948,260 B1 | 5/2011 | Shilshtut | |
| 8,237,475 B1 * | 8/2012 | Nagarajan et al. | 327/158 |
| 2002/0008503 A1 * | 1/2002 | Bucksch et al. | 324/76.54 |
| 2003/0179024 A1 * | 9/2003 | Montagnana | H03L 7/095 327/156 |
| 2004/0046596 A1 * | 3/2004 | Kaeriyama et al. | 327/165 |
| 2007/0164800 A1 * | 7/2007 | Josephson | 327/158 |
| 2010/0135443 A1 * | 6/2010 | Lackey | 375/346 |
| 2012/0100809 A1 * | 4/2012 | Lackey | 455/63.1 |
| 2013/0279616 A1 * | 10/2013 | Lackey | 375/267 |
| 2015/0004919 A1 * | 1/2015 | Ek | H04B 1/40 455/75 |

* cited by examiner

*Primary Examiner* — Ryan Jager

(57) ABSTRACT

An apparatus for phase alignment of clock signals includes a sampling circuit that samples a first clock signal on edges of a reference clock signal and that samples the reference clock signal on edges of the first clock signal, to generate a phase signal indicative of relative phase between the first clock signal and the reference clock signal. An alignment control circuit generates a control signal responsive to the phase signal, the control signal setting a phase shift direction for the first clock signal. A phase shifter shifts a phase of the first clock signal in the phase shift direction responsive to the control signal to align the phase of the first clock signal with a phase of the reference clock signal.

18 Claims, 7 Drawing Sheets

MULTIPLE SYNCHRONIZABLE SIGNAL GENERATORS USING A SINGLE FIELD PROGRAMMABLE GATE ARRAY

BACKGROUND

High-resolution frequency-synthesized signal generators are typically constructed using a single integrated circuit (IC) and additional support components for each channel, requiring significant board space and cost. In order to synchronize the output clock signals of respective first and second signal generators, an exclusive-OR operation may be performed on the corresponding first and second clock signals to provide a signal having a pulse width corresponding to the phase offset between the first and second clock signals. The exclusive-OR signal may be low pass filtered and the phase offset subsequently measured using an analog-to-digital converter (ADC). The measured phase offset may be used to adjust the phase of the clock signals. This procedure may be repeated for each output clock signal to be synchronized. The circuitry may be built using field programmable gate arrays (FPGAs).

However, a disadvantage of the above described solution is that analog components are required externally of the FPGA. That is, filters and ADCs are necessary. Moreover, since the measured phase offset value may be noisy, a substantial amount of averaging may be necessary to obtain acceptable resolution. The process may therefore be slow. Also, as the pulse width of the exclusive-OR signal narrows, the rise and fall characteristics of an output driver may consequently become significant, tending to skew the results. Still further, to reduce the need of expensive analog components, a single ADC may typically be used by the various channels in a time sharing manner, further slowing the process There is therefore a need to efficiently synchronize multiple signal generators without analog components, to provide less expensive and smaller design solutions.

SUMMARY

In a representative embodiment, an apparatus for generating aligned clock signals includes a first signal generator configured to generate a reference clock signal responsive to a system clock signal; a second signal generator configured to generate a first clock signal responsive to the system clock signal and a control signal; and a phase alignment circuit configured to sample the first clock signal on the reference clock signal and sample the reference clock signal on the first clock signal to determine whether a phase of the first clock signal lags or leads a phase of the reference clock signal, and to generate the control signal responsive to the sampling, the control signal setting a phase shift direction for the first clock signal, said second signal generator is further configured to shift the phase of the generated first clock signal responsive to the first control signal to align the phases of the first and reference clock signals.

In another representative embodiment, an apparatus for phase alignment of clock signals includes a sampling circuit configured to sample a first clock signal on edges of a reference clock signal and to sample the reference clock signal on edges of the first clock signal, to generate a phase signal indicative of relative phase between the first clock signal and the reference clock signal; an alignment control circuit configured to generate a control signal responsive to the phase signal, the control signal setting a phase shift direction for the first clock signal; and a phase shifter configured to shift a phase of the first clock signal in the phase shift direction responsive to the control signal to align the phase of the first clock signal with a phase of the reference clock signal.

In a still further representative embodiment, a method of aligning a first clock signal to a reference clock signal includes sampling the first clock signal on the reference clock signal; sampling the reference clock signal on the first clock signal; determining whether a phase of the first clock signal lags or leads a phase of the reference clock signal responsive to said samplings; setting a phase shift direction for the first clock signal responsive to said determining; and shifting the phase of the first clock signal in the phase shift direction by a phase interval to align the phase of the first clock signal with the phase of the reference clock signal.

In another further representative embodiment, a non-transitory computer readable medium that stores a program executable by a computer for aligning clock signals, the computer readable medium includes a sampling code segment for sampling a first clock signal on edges of a reference clock signal to generate a first signal indicative that a phase of the first clock signal leads a phase of the reference clock signal, and to sample the reference clock signal on edges of the first clock signal to generate a second signal indicative that the phase of the first clock signal lags the phase of the reference clock signal; an alignment control segment for generating a control signal responsive to the first and second signals, the control signal setting a phase shift direction for the first clock signal; and a phase shift control segment for shifting the phase of the first clock signal in the phase shift direction responsive to the control signal to align the phases of the first and reference clock signals.

BRIEF DESCRIPTION OF THE DRAWINGS

The illustrative embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable. As a further example, "substantially removed" means that one skilled in the art would consider the removal to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Figure 1:
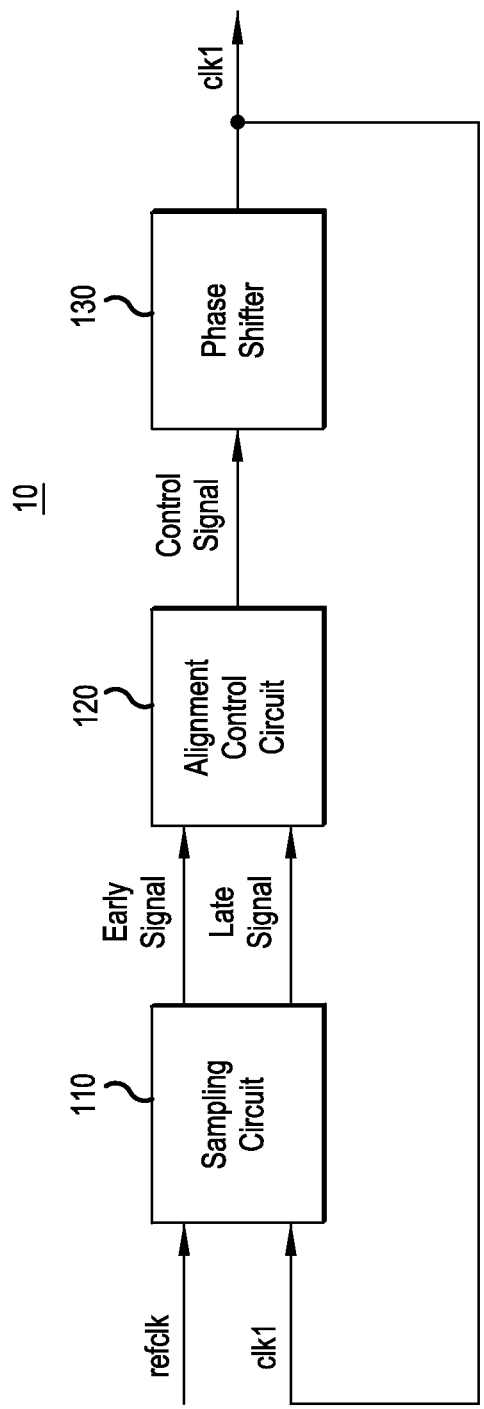
FIG. 1 is a block diagram illustrating a phase alignment circuit configured for phase alignment of clock signals, according to a representative embodiment.

FIG. 1 is a block diagram illustrating a phase alignment circuit 10 configured for phase alignment of clock signals, according to a representative embodiment.

Referring to FIG. 1, phase alignment circuit 10 includes sampling circuit 110, alignment control circuit 120 and phase shifter 130. Phase alignment circuit 10 is configured to align the phase of first clock signal clk1 with the phase of reference clock signal refclk. As understood in view of FIG. 1, phase shifter 130 is configured to provide a clock signal that is output phase alignment circuit 10 as first clock signal clk1 and that is also fed back to sampling circuit 110. Sampling circuit 110 receives first clock signal clk1 and reference clock signal refclk. Sampling circuit 110 samples first clock signal clk1 on edges of reference clock signal refclk, and samples reference clock signal refclk on edges of first clock signal clk1, to generate a phase signal indicative of relative phase between first clock signal clk1 and reference clock signal refclk.

In greater detail, sampling circuit 110 samples first clock signal clk1 on rising edges of reference clock signal refclk to generate an early (first) signal indicative that the phase of first clock signal clk1 leads the phase of reference clock signal refclk. Sampling circuit 110 further samples reference clock signal refclk on rising edges of first clock signal clk1 to generate a late (second) signal indicative that the phase of first clock signal clk1 lags the phase of reference clock signal refclk. The phase signal indicative of relative phase between first clock signal clk1 and reference clock signal refclk as previously described may thus be considered as including the early signal and the late signal. The early signal and the late signal as shown in FIG. 1 are output to alignment control circuit 120.

Alignment control circuit 120 receives the early signal and the late signal generated by sampling circuit 110 as the phase signal indicative of relative phase. Responsive to the early signal and the late signal (the phase signal), alignment control circuit 120 generates a control signal that sets a phase shift direction for first clock signal clk1. That is, alignment control circuit 120 generates a control signal that sets a phase shift direction that first clock signal clk1 should be shifted to align the phase of first clock signal clk1 with the phase of reference clock signal refclk. The control signal is output to phase shifter 130 as shown in FIG. 1. Alignment control circuit 120 may be a state machine implemented by hardware or software.

Phase shifter 130 subsequently shifts the phase of first clock signal clk1 in the set phase shift direction responsive to the control signal output from alignment control circuit 120 to align the phase of first clock signal clk1 with the phase of reference clock signal refclk. In a representative embodiment, phase shifter 130 may be a signal generator that generates first clock signal clk1 and that is also configured to shift the phase of first clock signal clk1 in either a forward direction or a reverse direction responsive to the control signal. In a representative embodiment, phase shifter 130 may be configured to incrementally shift the phase of first clock signal clk1 by a phase interval responsive to the control signal to incrementally align the phase of first clock signal clk1 with the phase of reference clock signal refclk. Phase shifter 130 may be a phase-locked loop that generates first clock signal clk1 responsive to a system clock, and that shifts the phase of first clock signal clk1 responsive to the control signal provided from alignment control circuit 120. In a representative embodiment, phase shifter 130 may be a fractional phase-locked loop.

Figure 2:
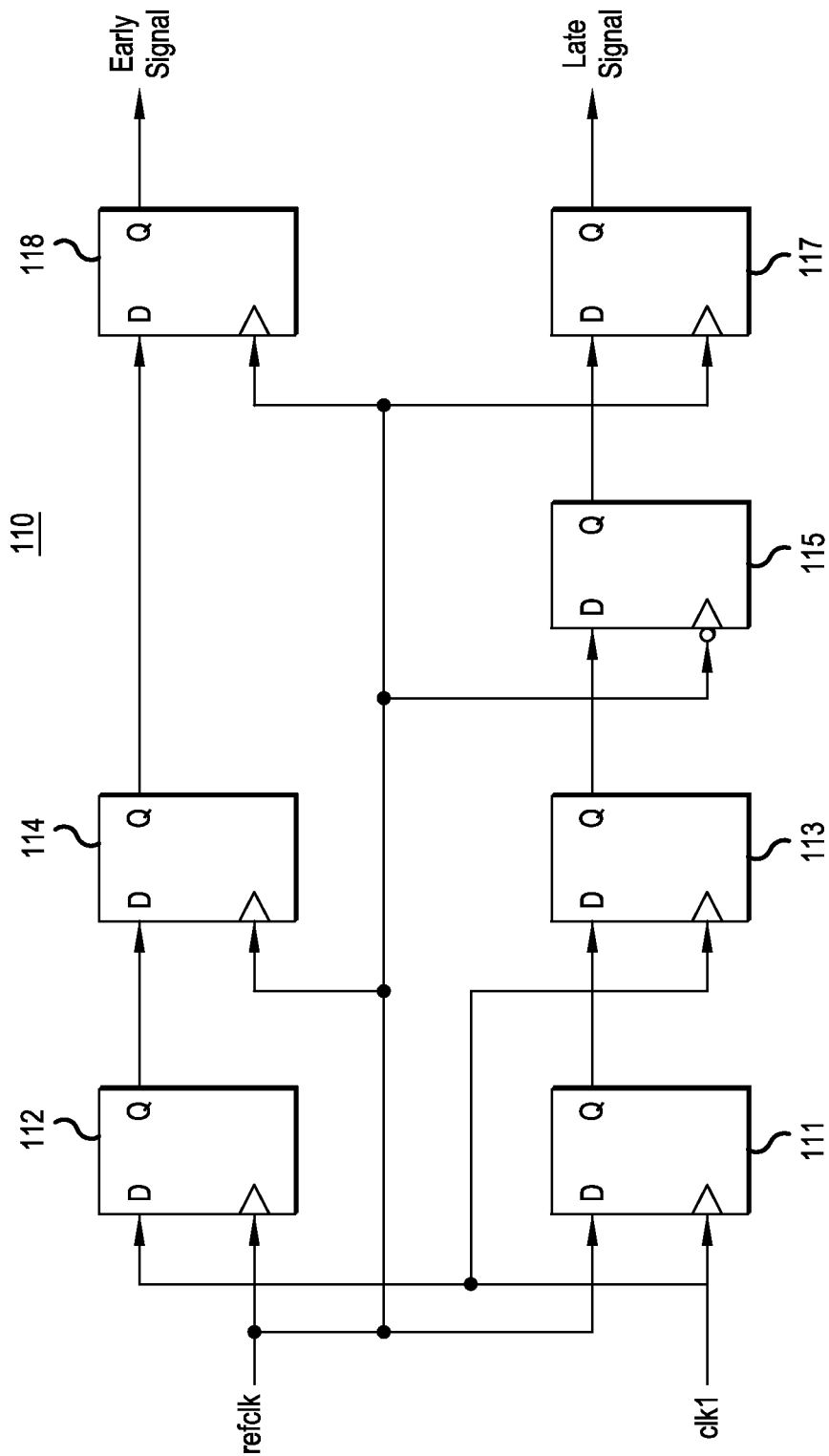
FIG. 2 is a block diagram illustrating a sampling circuit, according to a representative embodiment.

FIG. 2 is a block diagram illustrating sampling circuit 110, according to a representative embodiment.

Referring to FIG. 2, sampling circuit 110 includes a plurality of interconnected flip-flops 111, 112, 113, 114, 115, 117 and 118. In a representative embodiment, flip-flops 111, 112, 113, 114, 115, 117 and 118 may be D-type flip-flops. As shown in FIG. 2, reference clock signal refclk is connected to the clock input terminal of flip-flops 112, 114, 117 and 118. An inverted version of reference clock signal refclk is connected to the clock input terminal of flip-flop 115. First clock signal clk1 is connected to the clock input terminal of flip-flops 111 and 113. First clock signal clk1 is further connected to the D input terminal of flip-flop 112 which samples first clock signal clk1 on rising edges of reference clock signal refclk. The output of flip-flop 112 is connected to the D input terminal of flip-flop 114 and is again sampled on rising edges of reference clock signal refclk to avoid metastability issues. The output of flip-flop 114 is connected to the D input terminal of flip-flop 118 and is resampled in the reference clock signal refclk domain to provide an early signal that assumes a logical high value (1) to indicate that the phase of first clock signal clk1 leads the phase of reference clock signal refclk.

With further regard to FIG. 2, reference clock signal refclk is further connected to the D input terminal of flip-flop 111 which samples reference clock signal refclk on rising edges of first clock signal clk1. The output of flip-flop 111 is connected to the D input terminal of flip-flop 113 and is again sampled on rising edges of first clock signal clk1 to avoid metastability issues. The output of flip-flop 113 is connected to the D input terminal of flip-flop 115. Since the inverted version of the reference clock signal refclk is provided to the clock input terminal, flip-flop 115 samples the output of flip-flop 111 on falling edges of reference clock signal refclk rather than on rising edges. The output of flip-flop 115 is connected to the D input terminal of flip-flop 117 and is resampled in the reference clock signal refclk domain to provide a late signal that assumes a logical high value (1) to indicate that the phase of first clock signal clk1 lags the phase of reference clock signal refclk.

Flip-flops 115, 117 and 118 shown in FIG. 2 are implemented to make both the early and late signals synchronous to the same clock (reference clock signal refclk). Flip-flop 115 is included to deal with a potential race condition. In particular, an important condition exists when the rising edges of reference clock signal refclk and first clock signal clk are close in time, that is when they are close to being in phase with each other. If the output of flip-flop 113 was sampled directly by flip-flop 117 without flip-flop 115, sampling circuit 110 would function as intended if the phase of reference clock signal refclk was earlier than or the same as the phase of first clock signal clk1. However, in such a condition that the phase of reference clock signal refclk was a bit later than the phase of first clock signal clk1, without flip-flop 115 in the circuit flip-flop 117 would possibly sample the output of flip-flop 113 at the same time that flip-flop 117 was switching, providing indeterminate results. Flip-flop 115 is included to avoid the occurrence of such indeterminate results. In a further representative embodiment, flip-flops 112, 114, 117 and 118 may instead sample on falling edges of reference clock signal refclk, flip-flop 115 may instead sample on rising edges of the reference clock signal refclk, and flip-flops 111 and 113 may instead sample on falling edges of first clock signal clk1.

Figure 3:
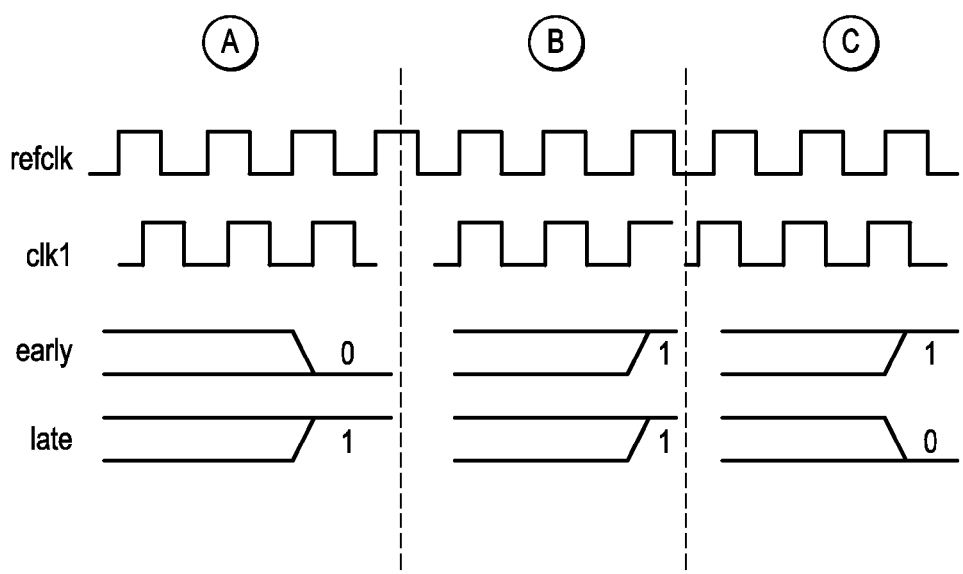
FIG. 3 is a graph illustrating clock signals applied to the sampling circuit, and the correspondingly early signal and late signal generated under different respective conditions, according to a representative embodiment.

FIG. 3 is a graph illustrating clock signals applied to sampling circuit 110, and the correspondingly early signal and late signal generated under different respective conditions, according to a representative embodiment.

Referring to FIG. 3, section A illustrates a condition that the phase of first clock signal clk1 lags (or is later) than the phase of reference clock signal refclk. That is, the late signal as provided by flip-flops 111, 113, 115 and 117 of sampling circuit 110 as shown in FIG. 2 assumes a logical high value to indicate that the phase of first clock signal clk1 lags the phase of reference clock signal refclk, while at the same time the early signal provided by flip-flops 112, 114 and 118 of sampling circuit 110 assumes a logical low value. Section C illustrates a condition that the phase of first clock signal clk1 leads (or is earlier) than the phase of reference clock signal refclk. That is, the early signal as provided by flip-flops 112, 114 and 118 of sampling circuit 110 assumes a logical high value to indicate that the phase of first clock signal clk1 leads the phase of reference clock signal refclk, while at the same time the late signal provided by flip-flops 111, 113, 115 and 117 of sampling circuit 110 assumes a logical low value. Section B illustrates a condition that the phase of the first clock signal clk1 is aligned with the phase of reference clock signal refclk. In this condition, both the early signal as provided by flip-flops 112, 114 and 118 of sampling circuit 110 and the late signal provided by flip-flops 111, 113, 115 and 117 assume a logical high value.

Figure 4:
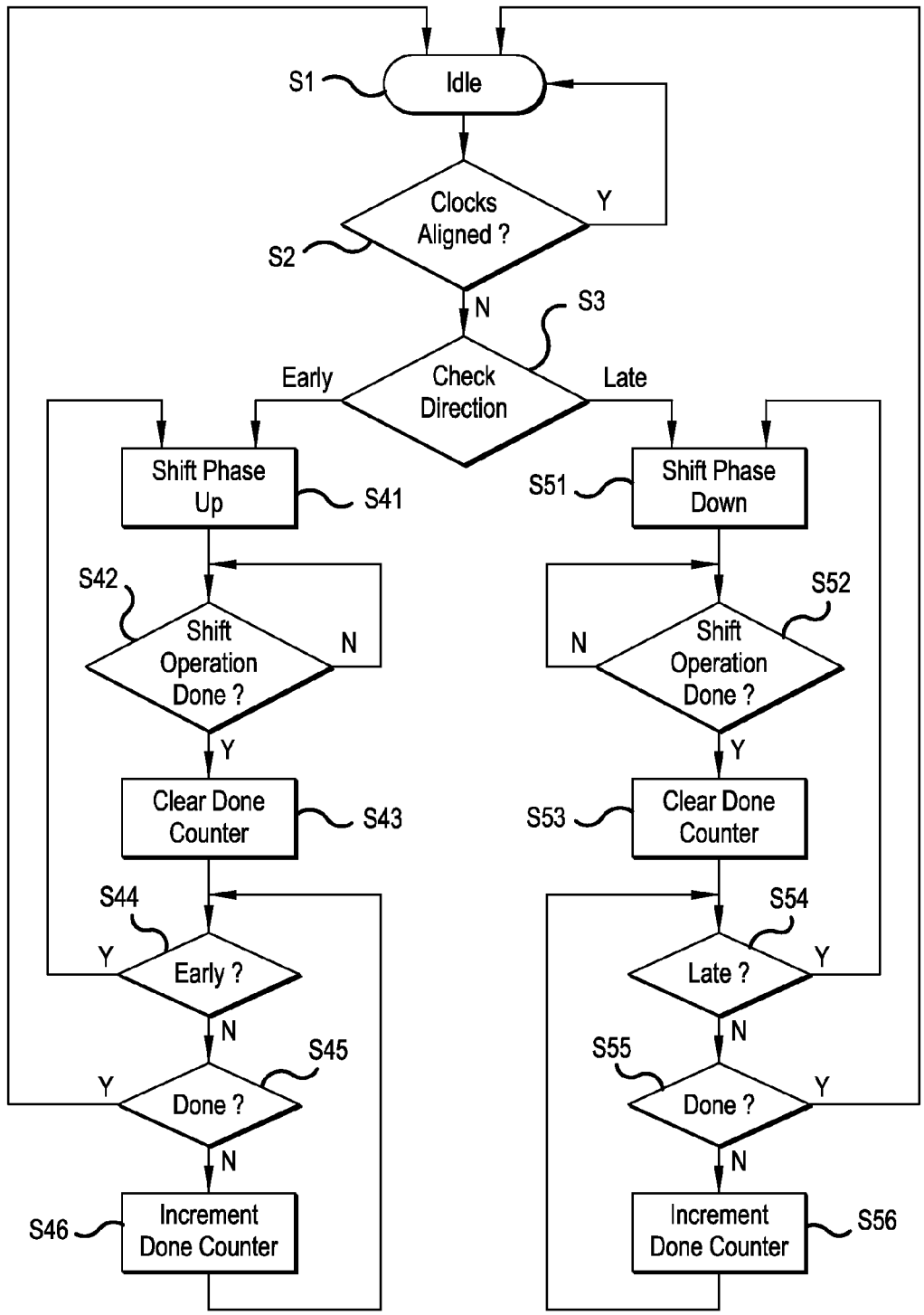
FIG. 4 is a flow diagram showing a process carried out by the alignment control circuit, according to a representative embodiment.

FIG. 4 is a flow diagram showing a process carried out by alignment control circuit 120, according to a representative embodiment.

Referring to FIG. 4, phase alignment circuit 10 shown in FIG. 1 may be considered as initially in an Idle state in step S1, or may be returned to the Idle state in step S1 once the phase of first clock signal clk1 is aligned with the phase of reference clock signal refclk, as will be subsequently described.

In step S2 shown in FIG. 4, once the alignment process is initiated, sampling circuit 110 samples first clock signal clk1 and reference clock signal refclk, and outputs the early and late signals to alignment control circuit 120. As described previously, alignment control circuit 120 may be a state machine implemented by hardware and may be configured as including various comparators, logic gates and registers necessary to carry out the operations described. Alignment control circuit 120 may include a processor coordinating operation and timing of the various hardware components via control signals and/or clock signals. In other representative embodiments, alignment control circuit 120 may be a state machine implemented using software and may include a processor and memory storing programming that instructs the processor to carry out the operations described. Upon receipt of the early and late signals from sampling circuit 110 responsive to a first sampling of first clock signal clk1 and reference clock signal refclk, alignment control circuit 120 determines in step S2 whether the phase of first clock signal clk1 is aligned with the phase of reference clock signal refclk. If both the early and late signals are a logical high value, the phases of first clock signal clk1 and reference clock signal refclk are determined to be aligned in step S2, and alignment control circuit 120 returns to the Idle state in step S1. If both the early and late signals are not a logical high value, the phases of the first clock signal clk1 and reference clock signal refclk are determined to not be aligned, and processing proceeds to step S3

In step S3 of FIG. 4, alignment control circuit 120 subsequently determines whether the phase of first clock signal clk1 lags or leads the phase of reference clock signal refclk, and sets the phase shift direction for first clock signal clk1 responsive to the early and late signals. If the early signal is a logical high value and the late signal is a logical low value, processing proceeds to step S41. In step S41, alignment control circuit 120 outputs the control signal instructing phase shifter 130 to shift the phase of first clock signal clk1 up or in the set forward direction by a set phase interval. Once determination is made to enter step S41, processing remains in the early loop and first clock signal clk1 is only moved in the forward direction one phase interval at a time until the phase of first clock signal clk1 is aligned with the phase of reference clock signal refclk. This prevents occurrence of an infinite loop where the phase of first clock signal clk1 is alternately moved up in the forward direction and then down in the reverse direction repeatedly.

After phase shifter 130 is instructed to shift the phase of first clock signal clk1 up in step S41, alignment control circuit 120 waits in step S42 a set number of additional sampling cycles so that the corresponding phase shift to first clock signal clk1 has sufficient time to propagate through phase alignment circuit 10. That is, if alignment control circuit 120 determines that the set number of additional sampling cycles has not occurred, the current shift operation is deemed to not be done, and processing loops through step S42. Once alignment control circuit 120 determines in step S42 that the set number of additional sampling cycles has occurred, processing proceeds to step S43. In step S43 alignment control circuit 120 clears a Done Counter. The Done Counter may be a hardware register, or a value stored in a memory by a processor. Processing subsequently enters step S44 after the Done Counter has been cleared.

After the initial phase shift operation is done, in step S44 first clock signal clk1 as shifted in step S41 and reference clock signal refclk are sampled by sampling circuit 110. Alignment control circuit 120 then determines in step S44 if the phase of first clock signal clk1 as shifted in step S41 still leads the phase of reference clock signal refclk based on early and late signals currently provided by sampling circuit 110. Upon determination by alignment control circuit 120 that the phase of first clock signal clk1 leads the phase of reference clock signal refclk in step S44, or in other words that the phase of first clock signal clk1 and reference clock signal refclk are not aligned, processing returns to step S41 and the phase of first clock signal clk1 is again shifted by the set phase interval and steps S42-S44 are repeated. Upon determination by alignment control circuit 120 in step S44 that the phase of first clock signal clk1 does not lead the phase of reference clock signal refclk, or in other words that the phases of the shifted first clock signal clk1 and reference clock signal refclk are aligned, processing proceeds to step S45.

After it is initially determined by alignment control circuit 120 in step S44 that the phases of first clock signal clk1 and reference clock signal refclk are aligned, alignment control circuit 120 waits a number of additional sampling cycles to confirm alignment. That is, alignment control circuit 120 is configured to repeat sampling of first clock signal clk1 and reference clock signal refclk a number of times to confirm alignment. In a representative embodiment, the number of additional sampling cycles may be preset. In a further representative embodiment, the number of additional sampling cycles may be adjustable.

In detail, after determination of initial alignment in step S44, alignment control circuit 120 determines in step S45 if the count value stored in the Done Counter is equal to the set number of additional cycles. Upon determination in step S45 that the count value stored in the Done Counter is equal to the set number of additional cycles, alignment of first clock signal clk1 and reference clock signal refclk is confirmed, and processing returns to the Idle state in step S1. Upon determination in step S45 that the count value stored in the Done Counter is not equal to the set number of additional cycles, processing proceeds to step S46 and the count value stored in the Done Counter is incremented, processing then returns to step S44, and steps S44 and S45 are repeated. Processing from step S45 through steps S46 and S44 back to step S45 is repeated until the count value stored in the Done Counter is equal to the set number of additional cycles, signifying confirmation of alignment of the phases of first clock signal clk1 and reference clock signal refclk.

In step S3 of FIG. 4, if the late signal is a logical high value and the early signal is a logical low value, processing proceeds to step S51 and thereafter follows in a somewhat similar manner as described with respect to the early loop including steps S41-S46.

In detail, in step S51, alignment control circuit 120 outputs the control signal instructing phase shifter 130 to shift the phase of the first clock signal clk1 down or in the set reverse direction by a phase interval. Once determination is made to enter step S51, processing remains in the late loop and first clock signal clk1 is only moved in the reverse direction one phase interval at a time until the phase of first clock signal clk1 is aligned with the phase of reference clock signal refclk.

After phase shifter 130 is instructed to shift the phase of first clock signal clk1 down in step S51, alignment control circuit 120 waits in step S52 a set number of additional sampling cycles so that the corresponding phase shift to first clock signal clk1 has sufficient time to propagate through phase alignment circuit 10. That is, if alignment control circuit 120 determines that the set number of additional sampling cycles has not occurred, the current shift operation is deemed to not be done, and processing loops through step S52. Once alignment control circuit 120 determines in step S52 that the set number of additional sampling cycles has occurred, processing proceeds to step S53. In step S53 alignment control circuit 120 clears the Done Counter. Processing subsequently enters step S54 after the Done Counter has been cleared.

After the initial phase shift operation is done, in step S54 first clock signal clk1 as shifted in step S51 and reference clock signal refclk are sampled by sampling circuit 110. Alignment control circuit 120 then determines in step S54 if the phase of first clock signal clk1 as shifted in step S51 still lags the phase of reference clock signal refclk based on early and late signals currently provided by sampling circuit 110. Upon determination by alignment control circuit 120 that the phase of first clock signal clk1 lags the phase of reference clock signal refclk in step S54, or in other words that the phase of first clock signal clk1 and reference clock signal refclk are not aligned, processing returns to step S51 and the phase of first clock signal clk1 is again shifted by the set phase interval and steps S52-S54 are repeated. Upon determination by alignment control circuit 120 in step S54 that the phase of first clock signal clk1 does not lag the phase of reference clock signal refclk, or in other words that the phases of the shifted first clock signal clk1 and reference clock signal refclk are aligned, processing proceeds to step S55.

After it is initially determined by alignment control circuit 120 in step S54 that the phases of first clock signal clk1 and reference clock signal refclk are aligned, alignment control circuit 120 waits a number of additional sampling cycles to confirm alignment. That is, alignment control circuit 120 is configured to repeat sampling of first clock signal clk1 and reference clock signal refclk a number of times to confirm alignment. As previously described, the number of additional sampling cycles may be preset or adjustable.

In detail, after determination of initial alignment in step S54, alignment control circuit 120 determines in step S55 if the count value stored in the Done Counter is equal to the set number of additional cycles. Upon determination in step S55 that the count value stored in the Done Counter is equal to the set number of additional cycles, alignment of first clock signal clk1 and the reference clock signal refclk is confirmed, and processing returns to the Idle state in step S1. Upon determination in step S55 that the count value stored in the Done Counter is not equal to the set number of additional cycles, processing proceeds to step S56 and the count value stored in the Done Counter is incremented, processing then returns to step S54, and steps S54 and S55 are repeated. Processing from step S55 through steps S56 and S54 back to step S55 is repeated until the count value stored in the Done Counter is equal to the set number of additional cycles, signifying confirmation of alignment of the phases of first clock signal clk1 and reference clock signal refclk.

Figure 5:
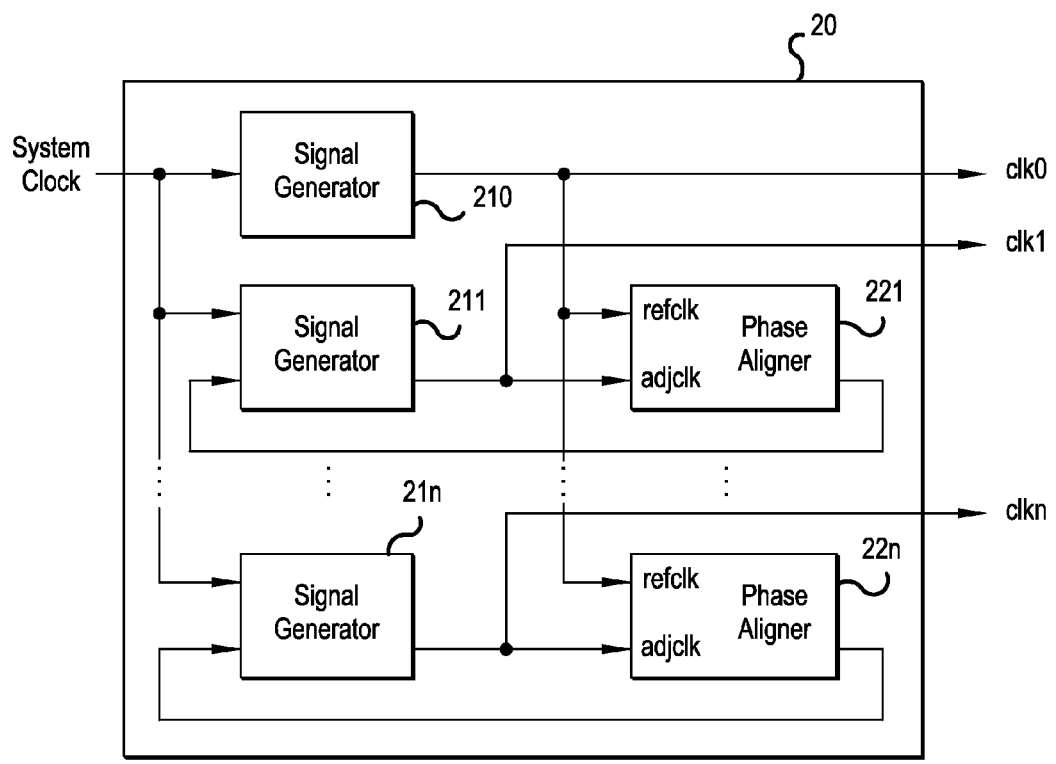
FIG. 5 is a block diagram illustrating a system for generating phase aligned clock signals constructed in a field programmable gate array (FPGA), according to a representative embodiment.

FIG. 5 is a block diagram illustrating a system for generating phase aligned clock signals constructed in a field programmable gate array (FPGA) 20, according to a representative embodiment.

Referring to FIG. 5, the system includes signal generators 210, 211 and 21n that respectively generate clock signals clk0, clk1 and clkn responsive to the system clock; and phase aligners 221 and 22n. In a representative embodiment, signal generators 210, 211 and 21n may be phase-locked loops. In still further representative embodiments, signal generators 210, 211 and 21n may be fractional phase-locked loops.

Phase aligner 221 shown in FIG. 5 may include a sampling circuit such as sampling circuit 110 shown in FIG. 1, the sampling circuit configured to receive clock signals clk0 and clk1 respectively at the refclk and adjclk terminals, to sample clock signals clk0 and clk1, and to generate early and late signals responsive to sampling of clock signals clk0 and clk1, in a manner similar to described with respect to FIGS. 2 and 3. Phase aligner 221 may also include an alignment control circuit such as alignment control circuit 120 shown in FIG. 1, the alignment control circuit configured to generate a control signal responsive to the sampling that generates the early and late signals. The control signal sets a phase shift direction that clock signal clk1 should be shifted to align the phase of clock signal clk1 with the phase of clk signal clk0. The control signal is output from phase aligner 221 to signal generator 211.

Signal generator 211 as shown in FIG. 5 is configured to shift the phase of clock signal clk1 in the set phase direction responsive to the control signal output from phase aligner 221 to align the phase of clock signal clk1 with the phase of clock signal clk0. In a representative embodiment, signal generator 211 may shift the phase of clock signal clk1 in a forward direction or a reverse direction responsive to the control signal. In a further representative embodiment, signal generator 211 may be configured to incrementally shift the phase of clock signal clk1 by a phase interval responsive to the control signal to incrementally align the phase of clock signal clk1 with the phase of clock signal clk0 in a manner similar to described with respect to FIG. 4. The phase interval may be preset, or may be adjustable.

Phase aligner 22n shown in FIG. 5 may also include a sampling circuit such as sampling circuit 110 shown in FIG. 1, the sampling circuit configured to receive clock signals clk0 and clkn respectively at the refclk and adjclk terminals, to sample clock signals clk0 and clkn, and to generate early and late signals responsive to sampling of clock signals clk0 and clkn, in a manner similar to described with respect to FIGS. 2 and 3. Phase aligner 22n may also include an alignment control circuit such as alignment control circuit 120 shown in FIG. 1, the alignment control circuit configured to generate a control signal responsive to the sampling that generates the early and late signals. The control signal sets a phase shift direction that clock signal clkn should be shifted to align the phase of clock signal clkn with the phase of clk signal clk0. The control signal is output from phase aligner 22n to signal generator 21n.

Signal generator 21n as shown in FIG. 5 is also configured to shift the phase of clock signal clkn in the set phase direction responsive to the control signal output from phase aligner 22n to align the phase of clock signal clkn with the phase of clock signal clk0. Signal generator 21n may shift the phase of clock signal clkn in a forward direction or a reverse direction responsive to the control signal, and may also be configured to incrementally shift the phase of clock signal clkn by a phase interval responsive to the control signal to incrementally align the phase of clock signal clkn with the phase of clock signal clk0. As described previously, the phase interval may be preset, or may be adjustable.

Accordingly, as shown in FIG. 5, a system or apparatus including first, second and third signal generators 210, 211 and 21n configured to respectively generate clock signal clk0 (reference clock signal), clock signal clk1 (first clock signal) and clock signal clkn (second clock signal), phase aligner 221 (phase alignment circuit) and phase aligner 22n (second phase alignment circuit), is constructed in a single FPGA without analog components. That is, signal generators 210 and 211 (first and second signal generators) and phase aligner 221 (phase alignment circuit) are constructed in a single FPGA 20. As should be understood, any number of corresponding pairs of signal generators and phase aligners may be constructed in FPGA 20.

Figure 6:
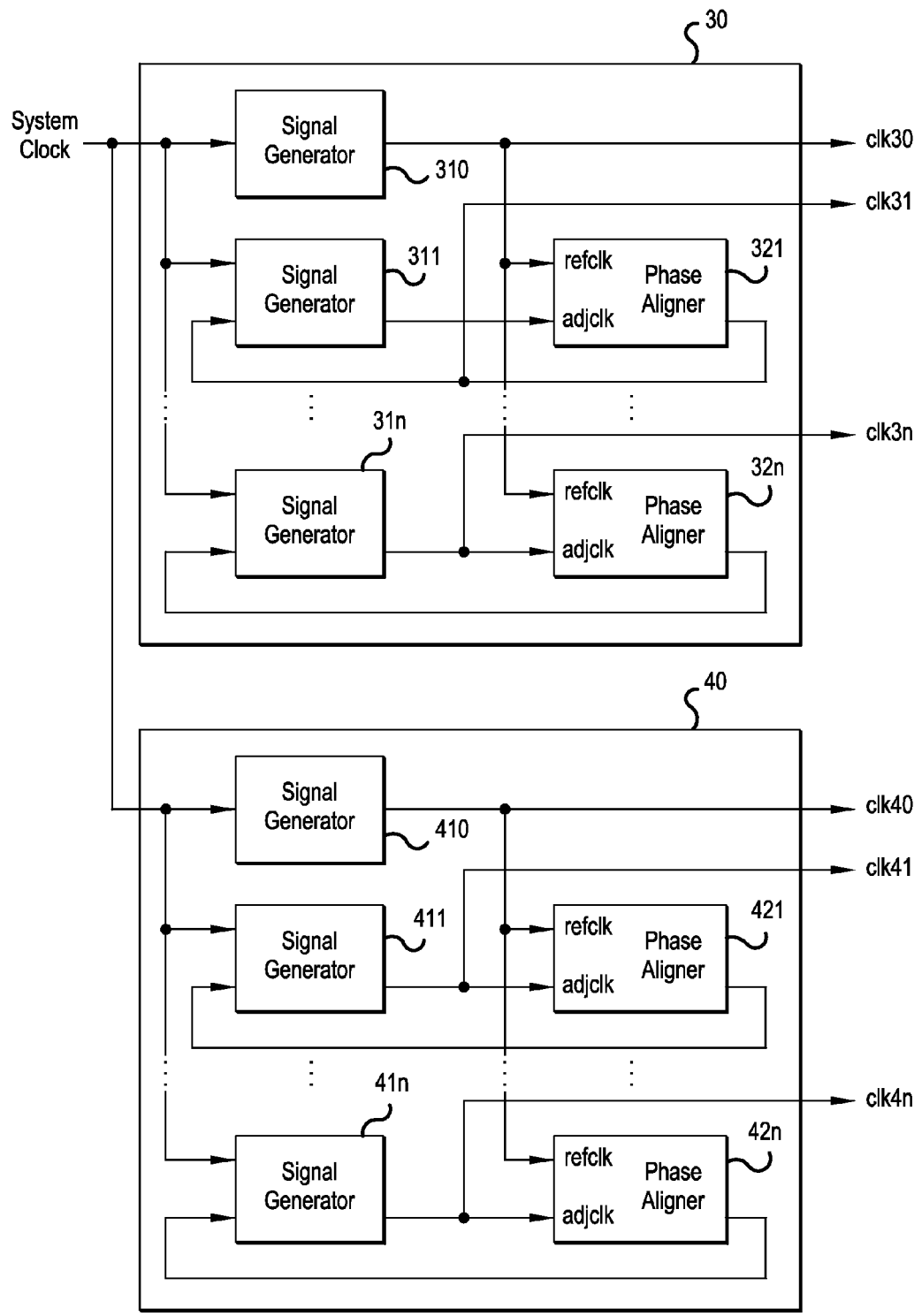
FIG. 6 is a block diagram illustrating a system for generating phase aligned clock signals constructed in respective first and second field programmable gate arrays (FPGAs), according to a representative embodiment.

FIG. 6 is a block diagram illustrating a system for generating phase aligned clock signals constructed in respective first and second field programmable gate arrays (FPGAs) 30 and 40, according to a representative embodiment.

Referring to FIG. 6, the system includes signal generators 310, 311 and 31n and phase aligners 321 and 32n constructed in first FPGA 30. Signal generators 310, 311 and 31n shown in FIG. 6 are configured to function in a similar manner as signal generators 210, 211 and 21n described with respect to FIG. 5. Similarly, phase aligners 321 and 32n shown in FIG. 6 are configured to function in a similar manner as phase aligners 221 and 22n described with respect to FIG. 5. Signal generators 310, 311 and 31n respectively generate clock signals clk30, clk31 and clk3n. Signal generators 311 and 31n are respectively configured to shift the phase of clock signals clk31 and clk3n responsive to control signals respectively output from phase aligners 321 and 32n. As should be understood, any number of corresponding pairs of signal generators and phase aligners may be constructed in FPGA 30.

Referring to FIG. 6, the system includes signal generators 410, 411 and 41n and phase aligners 421 and 42n constructed in second FPGA 40. Signal generators 410, 411 and 41n shown in FIG. 6 are configured to function in a similar manner as signal generators 210, 211 and 21n described with respect to FIG. 5. Similarly, phase aligners 421 and 42n shown in FIG. 6 are configured to function in a similar manner as phase aligners 221 and 22n described with respect to FIG. 5. Signal generators 410, 411 and 41n respectively generate clock signals clk40, clk41 and clk4n. Signal generators 411 and 41n are respectively configured to shift the phase of clock signals clk41 and clk4n responsive to control signals respectively output from phase aligners 421 and 42n. As should be understood, any number of corresponding pairs of signal generators and phase aligners may be constructed in FPGA 40.

Accordingly, as shown in FIG. 6, a system or apparatus including first, second and third signal generators 310, 311 and 31n configured to respectively generate clock signal clk30 (reference clock signal), clock signal clk31 (first clock signal) and clock signal clk3n (second clock signal), phase aligner 321 (phase alignment circuit) and phase aligner 32n (second phase alignment circuit), are constructed in a first FPGA 30 without analog components. Moreover, the system or apparatus further includes first, second and third signal generators 410, 411 and 41n configured to respectively generate clock signal clk40, clock signal clk41 and clock signal clk4n, phase aligner 321 and phase aligner 32n constructed in a second FPGA 40 without analog components. Multiple clock signals generated in different FPGAs may be aligned in phase with a reference clock signal generated responsive to a same system clock, without analog components. That is, signal generators 310 and 311 (first and second signal generators) and phase aligner 321 (phase alignment circuit) are constructed in a first FPGA 30, and signal generator 411 (third signal generator) and phase aligner 421 (second phase alignment circuit) are constructed in a second FPGA 40.

In a representative embodiment, the control signal provided from alignment control circuit 120 to phase shifter 130 shown in FIG. 1 may set a phase shift amount in addition to setting a phase shift direction for first clock signal clk1. Alignment control circuit 120 may thus initially incrementally shift the phase of first clock signal clk1 by a relatively large phase interval to get close to alignment, and may subsequently set a relatively small phase interval to obtain final phase alignment.

Figure 7:
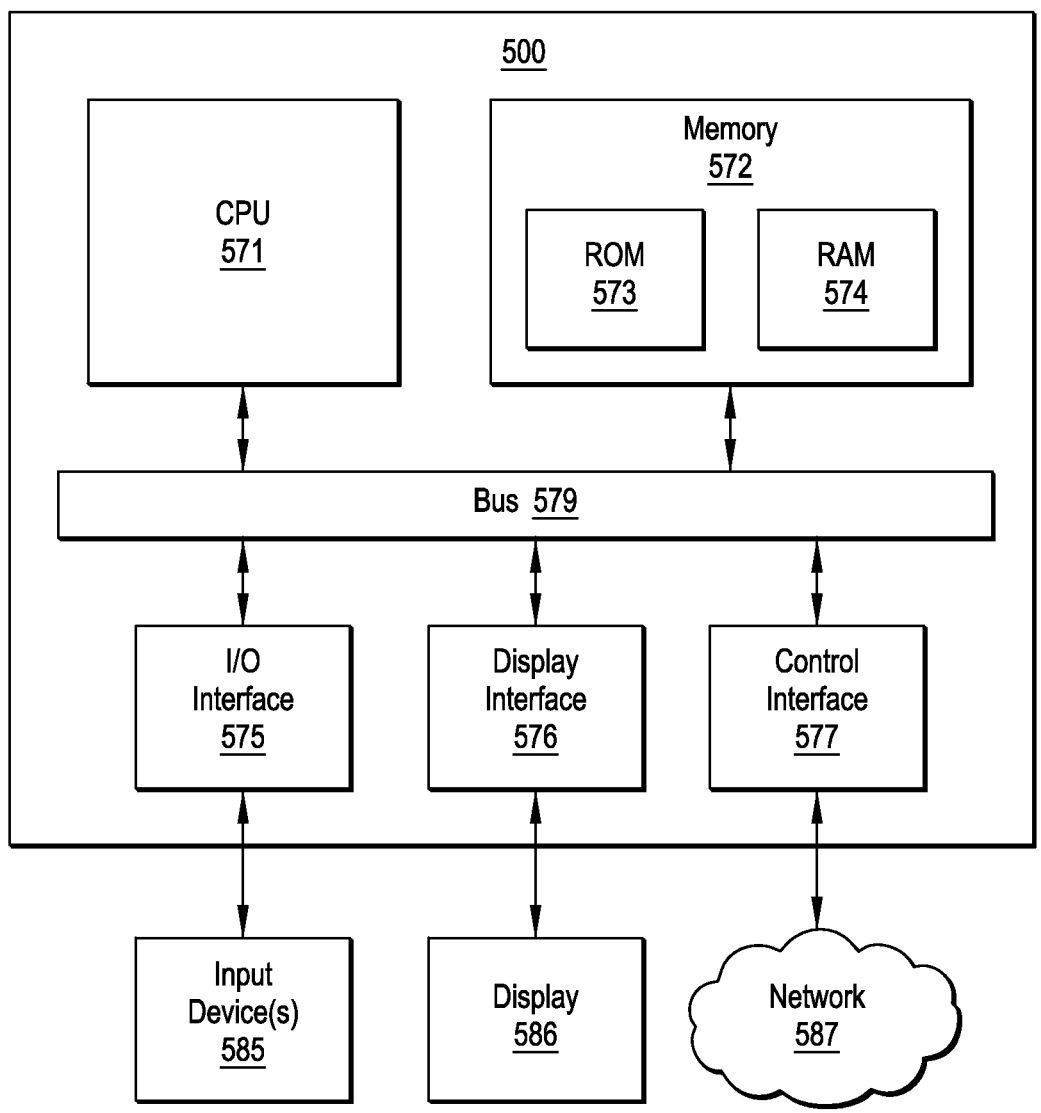
FIG. 7 is a block diagram illustrating a computer system for executing an algorithm for phase alignment of clock signals.

FIG. 7 is a block diagram illustrating a computer system 500 for executing an algorithm for phase alignment of clock signals, according to a representative embodiment. Computer system 500 may be configured to carry out the function of phase alignment circuit 10.

Referring to FIG. 7, computer system 500 may be any type of computer processing device, such as a PC, capable of executing the various steps of the programming language translation process. In FIG. 7, computer system 500 includes central processing unit (CPU) 571, memory 572, bus 579 and interfaces 575-577. Memory 572 includes at least nonvolatile read only memory (ROM) 573 and volatile random access memory (RAM) 574, although it is understood that memory 572 may be implemented as any number, type and combination of ROM and RAM and of internal and external memory. Memory 572 may provide look-up tables and/or other relational functionality. In various embodiments, memory 572 may include any number, type and combination of tangible computer readable storage media, such as a disk drive, compact disc (e.g., CD-R/CD/RW), electrically programmable read-only memory (EPROM), electrically erasable and programmable read only memory (EEPROM), digital video disc (DVD), universal serial bus (USB) drive, diskette, floppy disk, and the like. Further, memory 572 may store program instructions and results of calculations performed by CPU 571.

CPU 571 is configured to execute one or more software algorithms, including various embodiments described herein, e.g., in conjunction with memory 572. CPU 571 may include its own memory (e.g., nonvolatile memory) for storing executable software code that allows it to perform the various functions. Alternatively, the executable code may be stored in designated memory locations within memory 572. The CPU 571 may execute known operating systems.

In an embodiment, a user and/or other computers may interact with computer system 500 using input device(s) 585 through I/O interface 575. Input device(s) 585 may include any type of input device, for example, a keyboard, a track ball, a mouse, a touch pad or touch-sensitive display, and the like. Also, information may be displayed by computer system 500 on display 586 through display interface 576, which may include any type of graphical user interface (GUI), for example.

Computer system 500 may also include a control interface 577 for communicating with via a wired or wireless LAN, for example, indicated by network 587. The control interface 577 may include, for example, a transceiver (not shown), including a receiver and a transmitter, that communicates wirelessly over a data network through an antenna system (not shown), according to appropriate standard protocols. However, it is understood that the control interface 577 may include any type of interface, without departing from the scope of the present teachings.

In a representative embodiment, memory 572 may include a non-transitory computer readable storage medium that stores a program executable by CPU 571 for aligning clock signals, the computer readable medium including a sampling code segment for sampling a first clock signal on edges of a reference clock signal to generate a first signal indicative that a phase of the first clock signal leads a phase of the reference clock signal, and to sample the reference clock signal on edges of the first clock signal to generate a second signal indicative that the phase of the first clock signal lags the phase of the reference clock signal; an alignment control segment for generating a control signal responsive to the first and second signals, the control signal setting a phase shift direction for the first clock signal; and a phase shift control segment for shifting the phase of the first clock signal in the phase shift direction responsive to the control signal to align the phases of the first and reference clock signals.

While representative embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the representative embodiments described herein. More generally, those skilled in the art will readily appreciate that all parameters and configurations described herein are meant to be exemplary and that the actual parameters and/or configurations will depend upon the specific application or applications for which the teachings is/are used. Those skilled in the art will recognize, or be able to ascertain using no more than routine experimentation, many equivalents to the specific representative embodiments described herein. It is, therefore, to be understood that the foregoing embodiments are presented by way of example only and that, within the scope of the appended claims and equivalents thereto, representative embodiments may be practiced otherwise than as specifically described and claimed. In addition, any combination of two or more such features and/or methods, if such features and/or methods are not mutually inconsistent, is included within the inventive scope of the present disclosure.

For example, the flow diagram of FIG. 4 shows a process carried out by alignment control circuit 120 whereby first clock signal clk1 and reference clock signal refclk have a same frequency. Sampling circuit 110 in this case provides a phase signal including an early (first) signal indicative that the phase of first clock signal clk1 leads the phase of reference clock signal refclk, and a late (second) signal indicative that the phase of first clock signal clk1 lags the phase of reference clock signal refclk.

In a further representative embodiment, the frequency of first clock signal clk1 may be multiple of the frequency of reference clock signal refclk. In this case, sampling of the slower clock signal on the edge of the faster clock signal in sampling circuit 110 as shown in FIG. 2 gives an indeterminate result and can not be used. The result is that alignment control circuit 120 can use the early signal in the processing described with respect to FIG. 4 instead of using both the early and late signals. Substantially the same processing as described with respect to FIG. 4 applies, with the exception that instead of determining either of an early condition and a late condition in step S3, the processing determines either one of an early condition or a "Not Early" condition in step S3, and step S54 is changed to determine if the first clock signal clk1 as shifted in step S51 is "Not Early?". That is, processing branches from step S3 to the loop including steps S41-S46 responsive to the early condition, and branches from step S3 to the loop including steps S51-S56 responsive to the "not early" condition. The same type of modifications would apply for the case that the frequency of reference clock signal refclk is a multiple of the frequency of first clock signal clk1.

Also, in the representative embodiments as described, the early and late signals as generated by sampling circuit 110 shown in FIG. 2 change at the same time responsive to a phase adjustment. That is, upon receipt of an early signal having a logical low value and a late signal having a logical high value, alignment control circuit 120 will instruct adjustment of the phase of first clock signal clk1 until receipt of an early signal having a logical high value and a late signal having a logical low value. However, due to internal circuit delays, flip-flops in general will not sample exactly on an edge of a clock signal. Due to path delays and flip-flop design, when the phases of first clock signal clk1 and reference clock signal refclk are close, there may be a window where early and late signals output by sampling circuit 110 are either both high or both low. This would indicate a range of relative phase values where sampling circuit 110 may provide ambiguous results regarding the relative phases of the two clocks. In some implementations, the range of relative phase values where both the early and late signals have a logical high value (or logical low value) is small, and may be ignored.

There may however be a case that the range of relative phase values where the early and late signals both have a logical high value (or 1) or both have a logical low value (or 0) may be significant and/or may not be ignored. However, the symmetric nature of the sampling design allows the assumption of equal latency in both of the sampling paths. An unambiguous result can thus be obtained by determining what range of relative phase values result in both the early and late signals having the same value, and then adjusting the relative phases of the two clocks midway along the determined range.

For example, for the case that both the early and late signals are a logical high value (or 1), alignment control circuit 120 as shown in FIG. 2 may be configured to determine and save a phase P1 of first clock signal clk1 by first noting when the state of the early/late signals as provided by sampling circuit 110 respectively change from 0/1 to 1/1. Alignment control circuit 120 may be further configured to thereafter adjust the phase of first clock signal clk1 (using steps such as shown in FIG. 4) until the state of the early/late signals respectively change from 1/1 to 1/0, and then determine and save a phase P2 of first clock signal clk1 at the time of this state change. Alignment control circuit 120 may be configured to subsequently control phase shifter 130 via the control signal to correspondingly adjust the phase of first clock signal clk1 to the value (P1+P2)/2. To adjust the phase of first clock signal clk1 to the value (P1+P2)/2, alignment control circuit 120 may be further configured to first adjust first clock signal clk1 as indicated in steps S41 or S51 of FIG. 4 to phase P1, to then clear a counter, and to then adjust first clock signal clk1 to phase P2 while keeping a count C in the counter indicative of how many phase shift operations or steps were required to reach phase P2. First clock signal end may thereafter be adjusted in the opposite direction C/2 shift operations to the value (P1+P2)/2 midway along the determined range.

The phrase "and/or," as used herein in the specification and in the claims, should be understood to mean "either or both" of the elements so conjoined. In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. An apparatus for generating phase aligned clock signals comprising:
    a first signal generator configured to generate a reference clock signal responsive to a system clock signal;
    a second signal generator configured to generate a first clock signal responsive to the system clock signal and a control signal; and
    a phase alignment circuit configured to sample the first clock signal on the reference clock signal and sample the reference clock signal on the first clock signal to determine a relative phase between the first clock signal and the reference clock signal, to generate a phase signal indicative of whether a phase of the first clock signal lags, leads or is aligned with a phase of the reference clock signal responsive to said determination, and to generate the control signal responsive to the phase signal, the control signal setting a phase shift direction for the first clock signal,
    said second signal generator is further configured to shift the phase of the generated first clock signal responsive to the control signal to align the phases of the first clock signal and the reference clock signal,
    wherein the first and second signal generators comprise phase-locked loops.

2. The apparatus of claim 1, further comprising:
    a third signal generator configured to generate a second clock signal responsive to the system clock signal and a second control signal; and
    a second phase alignment circuit configured to sample the second clock signal on the reference clock signal and sample the reference clock signal on the second clock signal to determine a relative phase between the second clock signal and the reference clock signal, to generate a second phase signal indicative of whether a phase of the second clock signal lags, leads or is aligned with the phase of the reference clock signal, and to generate the second control signal responsive to the second phase signal, the second control signal setting a phase shift direction for the second clock signal,
    said third signal generator is further configured to shift the phase of the generated second clock signal responsive to the second control signal to align the phases of the second control signal and the reference clock signal.

3. The apparatus of claim 1, wherein the first and second signal generators and the phase alignment circuit are constructed in a single field programmable gate array (FPGA).

4. The apparatus of claim 2, wherein the first and second signal generators and the phase alignment circuit are constructed in a first field programmable gate array (FPGA), and
    the third signal generator and the second phase alignment circuit are constructed in a second field programmable gate array (FPGA).

5. The apparatus of claim 1, wherein the phase alignment circuit comprises:
    a sampling circuit configured to sample the first clock signal on edges of the reference clock signal to generate a first signal, and to sample the reference clock signal on edges of the first clock signal to generate a second signal, the phase signal comprising the first and second signals; and
    an alignment control circuit configured to generate the control signal responsive to the first and second signals.

6. The apparatus of claim 5, wherein the alignment control circuit comprises a state machine.

7. The apparatus of claim 1, wherein the second signal generator is configured to incrementally shift the phase of the first clock signal by a phase interval responsive to the control signal to incrementally align the phase of the first clock signal with the phase of the reference clock signal.

8. The apparatus of claim 7, wherein the phase interval is adjustable.

9. The apparatus of claim 1, wherein upon initial determination that the phases of the first clock signal and the reference clock signal are aligned, the phase alignment circuit is further configured to repeat sampling of the first clock signal and the reference clock signal a number of times to confirm alignment.

10. The apparatus of claim 9, wherein the number of times is adjustable.

11. The apparatus of claim 1, wherein the control signal further sets a phase shift amount.

12. An apparatus for phase alignment of clock signals comprising:
    a sampling circuit configured to sample a first clock signal on edges of a reference clock signal and to sample the reference clock signal on edges of the first clock signal, to determine a relative phase between the first clock signal and the reference clock signal, and to generate a phase signal indicative of whether a phase of the first clock signal leads, lags or is aligned with a phase of the reference clock signal responsive to the determination;
    an alignment control circuit configured to generate a control signal responsive to the phase signal, the control signal setting a phase shift direction for the first clock signal; and a phase shifter configured to shift a phase of the first clock signal in the phase shift direction responsive to the control signal to align the phase of the first clock signal with a phase of the reference clock signal,
wherein the phase shifter comprises a phase-locked loop.

13. The apparatus of claim 12, wherein the first clock signal and the reference clock signal have a same frequency, and
the phase signal comprises a first signal indicative that the phase of the first clock signal leads the phase of the reference clock signal, and a second signal indicative that the phase of the first clock signal lags the phase of the reference clock signal.

14. The apparatus of claim 12, wherein a frequency of the first clock signal is a multiple of a frequency of the reference clock signal.

15. The apparatus of claim 12, wherein the sampling circuit, the alignment control circuit and the phase shifter are constructed in a single field programmable gate array (FPGA).

16. The apparatus of claim 12, wherein the phase shifter is configured to generate the first clock signal, and to shift the phase of the first clock signal responsive to the control signal.

17. The apparatus of claim 12, wherein the phase shifter is configured to incrementally shift the phase of the first clock signal by a phase interval responsive to the control signal to incrementally align the phase of the first clock signal with the phase of the reference clock signal.

18. The apparatus of claim 12, wherein the control signal further sets a phase shift amount.

\* \* \* \* \*